United States Patent
Kamei

(10) Patent No.: US 7,365,586 B2
(45) Date of Patent: Apr. 29, 2008

(54) HYSTERESIS-TYPE INPUT CIRCUIT

(75) Inventor: Soichiroh Kamei, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/056,288

(22) Filed: Feb. 10, 2005

(65) Prior Publication Data
US 2005/0218950 A1    Oct. 6, 2005

(30) Foreign Application Priority Data
Feb. 10, 2004    (JP) ............... 2004-033239

(51) Int. Cl.
*H03K 3/00*    (2006.01)
(52) U.S. Cl. .................. 327/206; 327/205
(58) Field of Classification Search ............. 327/205, 327/206
See application file for complete search history.

(56) References Cited

U.S. PATENT DOCUMENTS

| 5,113,098 | A | 5/1992 | Teymouri |
| 5,459,437 | A * | 10/1995 | Campbell .................... 331/111 |
| 5,595,361 | A * | 1/1997 | Remington et al. ......... 246/276 |
| 5,878,094 | A | 3/1999 | Nowak et al. |
| 5,949,265 | A | 9/1999 | Bracchitta et al. |
| 5,990,700 | A * | 11/1999 | Park ............................ 326/22 |
| 6,204,786 | B1 | 3/2001 | Bieth et al. |
| 6,433,602 | B1 * | 8/2002 | Lall et al. .................... 327/205 |

FOREIGN PATENT DOCUMENTS

JP    08-162923    * 6/1996

* cited by examiner

*Primary Examiner*—Kenneth B. Wells
*Assistant Examiner*—Ryan C. Jager
(74) *Attorney, Agent, or Firm*—William B. Kempler; W. James Brady, III; Frederick J. Telecky, Jr.

(57) ABSTRACT

Hysteresis circuit 10 is composed of three inverters 40, 42, 44. Node $N_B$ in hysteresis circuit 10 is connected to the input terminal of transition-detecting part 14 of transmission control part 12. Transition-detecting part 14 detects the timing of the start of the output inversion operation and the timing of the completion of the transition in hysteresis circuit 10 corresponding to potential $V_B$ of node $N_B$, and it controls activation/deactivation of inverter 50 on the signal transmission path.

11 Claims, 10 Drawing Sheets

HYSTERESIS-TYPE INPUT CIRCUIT

FIELD OF THE INVENTION

The present invention pertains to a type of input circuit for input of a digital signal. More specifically, the present invention pertains to a hysteresis-type input circuit having hysteresis in the input/output transmission characteristic.

BACKGROUND OF THE INVENTION

FIG. 15 is a diagram illustrating the basic constitution of a hysteresis-type input circuit used in digital circuits in the prior art. FIG. 17 is a diagram illustrating the waveforms of various portions of said input circuit.

Hysteresis circuit 100 contained in said hysteresis-type input circuit, for example, has the hysteresis-type input/output transmission characteristic shown in FIG. 16. More specifically, for voltage $V_{in}$ of input signal $S_{in}$, a lower trip point LTP (lower trip point) having a prescribed value and an upper trip point UTP (upper trip point) having a prescribed value exist. When input voltage $V_{in}$ rises from the L level stable value or minimum value $LV_{in}$ (usually 0 V) to the H level stable value or maximum value $HV_{in}$, UTP becomes the threshold. When original input voltage $V_{in}$ is lower than UTP and output voltage $V_a$ is at the H level, as input voltage $V_{in}$ rises above UTP, output voltage $V_a$ is instantly inverted from the H level to the L level. When input voltage $V_{in}$ falls from H level stable value $HV_{in}$ to L level stable value $LV_{in}$, LTP becomes the threshold. When original input voltage $V_{in}$ is higher than LTP and output voltage $V_a$ is at the L level, as input voltage $V_{in}$ falls below LTP, output voltage $V_a$ is instantly inverted from the L level to the H level.

In this way, in hysteresis circuit 100, with respect to a rise of input voltage $V_{in}$ from the L level to the H level, a first output inversion operation is performed with inversion of output voltage $V_a$ from the H level to the L level at UTP. With respect to a fall of input voltage $V_{in}$ from the H level to the L level, a second output inversion operation is performed with inversion of output voltage $V_a$ from the L level to the H level at LTP. The state in the circuit when said first output inversion operation is performed (the first state) and the state in the circuit when the second output inversion operation is performed (the second state) are different from each other. After performing the first output inversion operation, transition occurs to the second state. After performing the second output inversion operation, transition occurs to the first state. Said transitions are not performed instantly, and there is a time-delay before completion.

As shown in FIG. 15, in the conventional hysteresis-type input circuit, on the output side of hysteresis circuit 100, one or several stages of inverter 102 (three stages in the example shown in the figure: (102A), (102B), (102C)) for waveform shaping or line driving are set in a cascade connection. In this case, in hysteresis circuit 100, when output voltage $V_a$ is changed from the L level to the H level or from the H level to the L level with input voltage $V_{in}$ at LTP or UTP, it passes by the inversion threshold of the downstream inverter, especially the inversion threshold $Vt_a$ of the first stage inverter (102A). Corresponding to this, the logic level of output voltage $V_b$ of inverter (102A) is inverted. In the downstream inverters (102B), (102C), too, the same output inversion operation is performed as a chain, and, in the output of the last stage inverter (102C), binary signal $S_{out}$ having voltage $V_d$ of the same logic level as that of voltage $V_{in}$ of input signal $S_{in}$ in the steady or DC (direct current) state.

As shown in FIG. 17, in said hysteresis-type input circuit, even when glitches $G_1$, $G_2$ are riding on a rising waveform or a falling waveform of input signal $S_{in}$ between LTP and UTP, said glitches $G_1$, $G_2$ are masked with the hysteresis input/output characteristic of hysteresis circuit 100 with said constitution, so that noise pulses are not displayed on output signal, $S_{out}$.

However, for said conventional hysteresis-type input circuit with the aforementioned constitution, when a glitch (such as glitch G3 shown in FIG. 17) that arrives near LTP or UTP rides on a rising waveform or a falling waveform of input signal $S_{in}$, the noise pulse corresponding to said glitch $G_3$ may be transmitted on the downstream signal transmission path. In the following, the case when a noise pulse is generated due to said glitch will be explained with reference to FIG. 18.

As shown in FIG. 18, at time $t_1$ when input voltage $V_{in}$ crosses LTP during the course of its fall, hysteresis circuit 100 performs a second output inversion operation. Corresponding to this operation, in downstream inverters (102A), (102B), (102C), the output inversion operations are performed as a chain, and voltage $V_d$ of output signal $S_{out}$ is changed from the hitherto H level to the L level. When hysteresis circuit 100 performs the second output inversion operation at said time $t_1$, transition starts from the hitherto state, that is, the second state, to the first state as the state in which the first output inversion operation can be performed at UTP.

However, in the case of glitch $G_3$ shown in the figure, once input voltage $V_{in}$ crosses LTP and then rises immediately, output voltage $V_a$ that was higher than inversion threshold $Vt_a$ turns to fall. When there is a large rise and change of glitch $G_3$, although input voltage $V_{in}$ is lower than UTP, output voltage $V_a$ crosses inversion threshold $Vt_a$. That is, the same result as obtained in the first output inversion operation at UTP appears in the output of hysteresis circuit 100. From another viewpoint, as shown in FIG. 18, when the rising change of input voltage $V_{in}$ rises above floating trip point UTP' during its course as it changes (rises) to UTP, the same abnormal output inversion operation as the first output inversion operation is performed, and output voltage $V_a$ crosses inversion threshold $Vt_a$. Corresponding to this operation, in the downstream inverters (102A), (102B), (102C), the output inversion operation is performed as a chain, and voltage $V_d$ of output signal $S_{out}$ returns from the L level to the H level at an undesired timing.

Then, in hysteresis circuit 100, at time $t_2$ when the output inversion operation is performed abnormally at UTP', the distribution of transition is inverted to the second state. However, in the case of glitch $G_3$ as shown in the figure, input voltage $V_{in}$ rises above floating trip point UTP' and then immediately turns back and falls. As this falling change crosses floating trip point LTP' during the course of its transition (fall) towards LTP, at this time $t_3$, the same abnormal output inversion operation as that of the second output inversion operation is performed, and output voltage $V_a$ again rises above inversion threshold $Vt_a$. As a result, corresponding to this operation, downstream inverters (102A), (102B), (102C) perform output inversion operations as a chain, and voltage $V_d$ of output signal $S_{out}$ returns from the H level to the L level. In this way, an undesired pulse or glitch pulse np corresponding to glitch $G_3$ is transmitted to the downstream circuit, not shown in the figure.

When the operation of inverters (102A), (102B), (102C) is delayed, it becomes impossible to follow the minuscule-yet-fast change as a glitch. Consequently, it is also possible to mask a glitch pulse with said inverters. However, with progress in semiconductor process technology in recent years, transistors have achieved higher-speed operation, and it is quite possible that a glitch pulse will pass and be transmitted to a downstream or internal circuit.

A general object of the present invention is to solve the problems of the prior art by providing a hysteresis-type input circuit characterized by the fact that for any glitch riding on the voltage waveform of the input signal, it can always guarantee stable hysteresis characteristic, and an undesired pulse waveform will not be transmitted to the downstream circuit.

SUMMARY OF THE INVENTION

This and other objects and features of the invention are provided in accordance with one aspect of the present invention by a hysteresis-type input circuit is provided characterized by the fact that it has a hysteresis circuit, which has a first trip point that has a prescribed value at which the voltage of the output signal with respect to the voltage of the input signal is changed from a second logic level to a first logic level, and a second trip point that has a prescribed value at which the voltage is changed from the first logic level to the second logic level, and which undergoes bidirectional transition with a time-delay between the first state in which operation is performed at said first trip point and the second state in which operation is performed at said second trip point, and it has a transmission control part that performs the following operation: in said hysteresis circuit, when transition is made from said first state to said second state or from said second state to said first state, it prohibits or delays transmission of the output signal of said hysteresis circuit to the downstream circuit before said transition has been essentially completed.

According to another aspect of the present invention, it provides a hysteresis-type input circuit characterized by the fact that it has a hysteresis circuit, which has a first trip point that has a prescribed value at which the voltage of the output signal with respect to the voltage of the input signal is changed from a second logic level to a first logic level, and a second trip point that has a prescribed value at which the voltage is changed from the first logic level to the second logic level, and which performs transition to a second operable state at said second trip point after performing the first output inversion operation at said first trip point, and transition to a first operable state at said first trip point after performing said second output inversion operation at said second trip point, and it has a transmission control part that performs the following operation: in said hysteresis circuit, when said first output inversion operation or second output inversion operation is performed, it prohibits or delays transmission of the output signal of said hysteresis circuit of said hysteresis circuit to the downstream circuit before the transition to said second state or first state is essentially completed.

For the hysteresis-type input circuit in accordance with an aspect of the present invention, the operating state in the hysteresis circuit is monitored with a transmission control part. Especially, the state of essentially complete transition from the start of the output inversion operation at the normal trip point to the next stable state (first state or second state) is detected. At this time, the output signal of the hysteresis circuit is transmitted to the downstream circuit. As a result, even when the voltage of the input signal varies as a glitch and influences the node potential in the hysteresis circuit during the period from the normal output inversion operation to completion of the transition, the influence on the downstream circuit (transmission) can be cut off, and it is possible for the output signal of the hysteresis circuit to be transmitted to the downstream circuit after completion of the transition when the state becomes stable.

As a preferable embodiment of the present invention, said transmission control part detects the timing at which said transition has been essentially completed according to the potential of a prescribed node in said hysteresis circuit. As explained above, even when the voltage of the input signal varies as a glitch and the node potential in the hysteresis circuit is influenced during the period from a normal output inversion operation to completion of a transition, the influence completely subsides (ends) at the time when said transition is essentially completed, and the stable state can be checked through the potential of the prescribed node.

As a preferable embodiment of the present invention, said transmission control part has first inverter, which has a first inversion threshold corresponding to said first trip point, and which outputs a first logic level when the potential of said prescribed node is lower than said first inversion threshold, and outputs a second logic level when said potential of said prescribed node is higher than said first inversion threshold, and a second inverter, which has a second inversion threshold corresponding to said second trip point, and which outputs a first logic level when the potential of said prescribed node is lower than said second inversion threshold, and outputs a second logic level when said potential of said prescribed node is lower than said second inversion threshold; the timing at which the outputs of said first inverter and second inverter are changed from the same logic level to different logic levels is adopted as the first timing; the timing at which the outputs of said first inverter and second inverter are changed from different logic levels to the same logic level is adopted as the second timing, and, with said second timing, the timing is adopted as that at which said transition has been essentially completed. In this case, as a preferable scheme, said first inversion threshold is set with respect to said first trip point at a value that is offset to the side opposite said second trip point side, and said second inversion threshold is set with respect to said second trip point at a value that is offset to the side opposite said first trip point side.

As another preferable embodiment of the present invention, said hysteresis circuit has a third inverter that has said input signal input to its input terminal and has its output terminal connected to a first node, a fourth inverter that has its input terminal connected to said first node and its output terminal connected to a second node, and a fifth inverter that has its input terminal connected to said second node and its output terminal connected to said first node. In this case, said fifth inverter is composed of a MOS transistor of a first electroconductive type connected between a first power source voltage terminal and said first node and a MOS transistor of a second electroconductive type connected between a second power source voltage terminal and said first node; the threshold of said MOS transistor of said first electroconductive type is defined by one of said first trip point or second trip point, and the threshold of said MOS transistor of said second electroconductive type is defined by the other of said first trip point and second trip point.

As another preferable embodiment of the present invention, said transmission control part detects the timing at which said transition has been essentially completed in said hysteresis circuit according to the potential of said second node.

As another preferable embodiment of the present invention, said transmission control part has a sixth inverter having its input terminal connected to said first node, and it detects the timing at which said transition has been essentially completed in said hysteresis circuit according to the potential of the output node of said sixth inverter. In this case, it is possible to set the load of the second node at a small value and to improve the speed of said transition. In addition, said transmission control part detects the timing at which said transition has been essentially completed in said hysteresis circuit according to the potential of said first node.

As another preferable embodiment of the present invention, said transmission control part has a gate circuit set in the signal transmission path on the downstream side of said hysteresis circuit, and it cuts off said gate circuit when said first output inversion operation or second output inversion operation is started, and it turns ON said gate circuit after said transition has been essentially completed.

As another preferable embodiment of the present invention, said transmission control part has a driver that drives the signal transmission path on the downstream side to the first logic level or the second logic level corresponding to the potential of the prescribed node of said hysteresis circuit.

According to another aspect of the present invention, it provides a hysteresis-type input circuit characterized by the following facts: it has a first inverter that has its input terminal connected to a signal input terminal and its output terminal connected to a first node, a second inverter that has its input terminal connected to said first node and its output terminal connected to a second node, a third inverter that has its input terminal connected to said second node and its output terminal connected to said first node, a fourth inverter that has its input terminal connected to said second node and its output terminal connected to a third node, a fifth inverter that has its input terminal connected to said second node and its output terminal connected to a fourth node, a first transistor and a second transistor connected in series between a first power source terminal and an output terminal, and a third transistor and a fourth transistor connected in series between a second power source terminal and said output terminal; the gate terminals of said first transistor and said fourth transistor are connected to said third node; the gate terminals of said second transistor and said third transistor are connected to said fourth node, and the threshold voltage of said fourth inverter is different from that of said fifth inverter.

In one aspect of the hysteresis-type input circuit, it is preferred that the threshold voltage of said fourth inverter be lower than that of said fifth inverter.

As a preferable embodiment of the present invention, said first transistor and second transistor are pMOS transistors; said third transistor and fourth transistor are nMOS transistors, and a midpoint connection between the drain terminal of said second transistor and the drain terminal of said fourth transistor is connected to said output terminal.

REFERENCE NUMERALS AND SYMBOLS AS SHOWN IN THE DRAWINGS

In the figures, 10 represents a hysteresis circuit, 12 a transmission control part, 14 a transition-detecting part, 16 a signal transmission path, 18 a gate circuit (transmission gate), 20 a driver, 30 a hysteresis-type input circuit, 40, 42, and 44 inverters, 46 a pMOS transistor, 48 a nMOS transistor, 50, 52, and 54 inverters, 56 a node keeper, 60 an inverter, 62 an inverter, 64 an EXOR circuit, 70 and 72 pMOS transistors, 74 and 76 nMOS transistors, 80 an inverter and $N_A$, $N_B$, $N_C$, $N_D$, $N_E$ and $N_F$ nodes.

DESCRIPTION OF THE EMBODIMENTS

For the hysteresis-type input circuit of the present invention, due to the aforementioned constitution and operation, even when glitches and noises are riding on the voltage waveform of the input signal, the hysteresis characteristic can always be guaranteed, so that an undesired pulse waveform will not be transmitted to the downstream circuit.

In the following, optimal embodiments of the present invention will be explained with reference to FIGS. 1-14.

Figure 1:
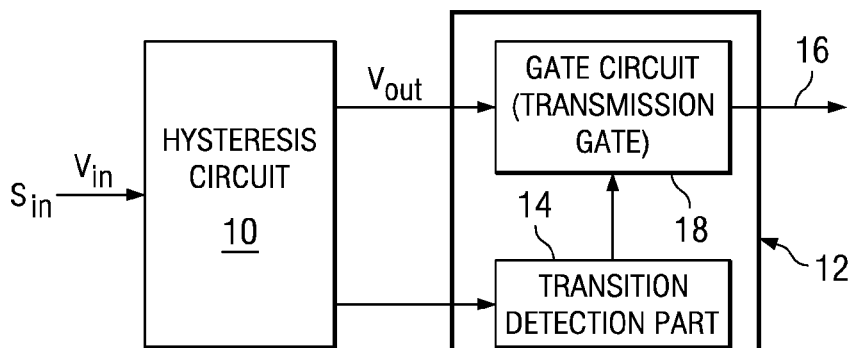
FIG. 1 is a block diagram illustrating a basic constitution of the hysteresis-type input circuit of the present invention.
Figure 2:
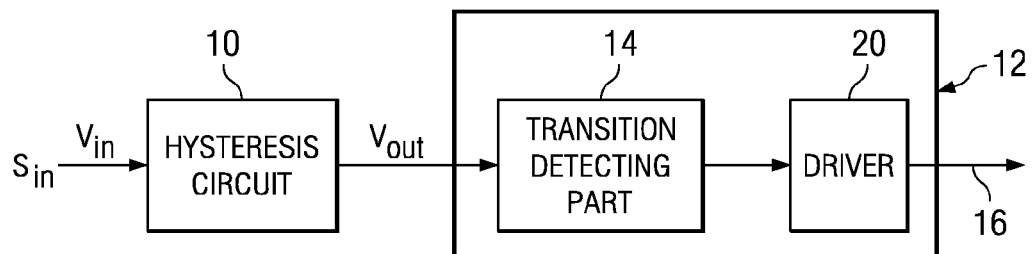
FIG. 2 is a block diagram illustrating another basic constitution of the hysteresis-type input circuit of the present invention.

FIGS. 1 and 2 illustrate basic constitutions of the hysteresis-type input circuit of the present invention. The hysteresis-type input circuit of the present invention has hysteresis circuit 10 having a hysteresis-type input/output transmission characteristic shown in FIG. 3 or 4, and transmission control part 12 that controls signal transmission on the output side corresponding to the timing of the output inversion operation and transition between states of said hysteresis circuit 10. Hysteresis circuit 10 has digital signal $S_{in}$ (input voltage $V_{in}$) having binary logic levels (H level/L level) input to it, and it outputs output voltage $V_{out}$ having binary logic levels.

In the input/output characteristic of hysteresis circuit 10, with respect to input voltage $V_{in}$, lower trip point LTP having a prescribed value and upper trip point UTP having another prescribed value exist, and, with respect to output voltage $V_{out}$, prescribed inversion threshold $Vt_A$ exists.

Figure 3:
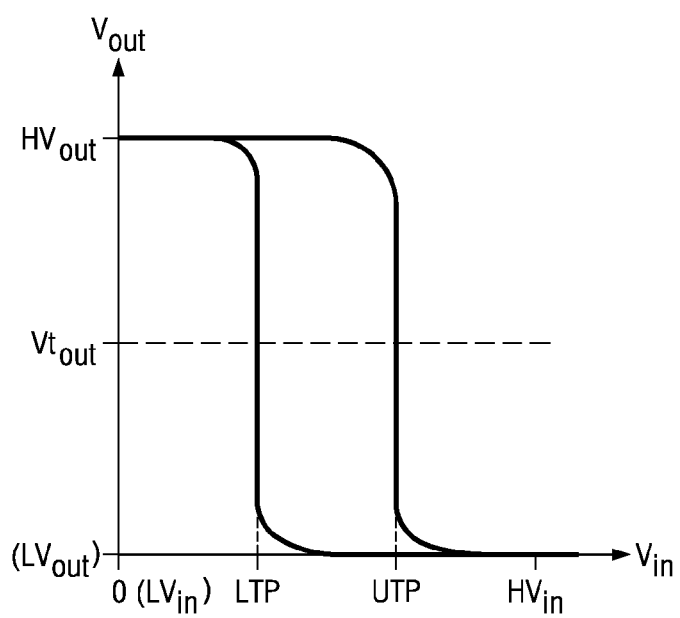
FIG. 3 is a diagram illustrating an example of hysteresis-type input/output transmission characteristic.

In the input/output characteristic shown in FIG. 3, when input voltage $V_{in}$ rises from the L level stable value or minimum value $LV_{in}$ (usually 0 V) to the H level stable value or maximum value $HV_{in}$, the UTP is the threshold, and, with input voltage $V_{in}$ originally lower than the UTP and output voltage $V_{out}$ at the H level (>$Vt_A$), as input voltage $V_{in}$ rises above the UTP, output voltage $V_{out}$ instantly changes from the H level to the L level (<$Vt_A$). When input voltage $V_{in}$ falls from H level stable value $HV_{in}$ to the L level stable value $LV_{in}$, the LTP is the threshold, and, with input voltage $V_{in}$ originally higher than the LTP and output voltage $V_{out}$ at the L level, as input voltage $V_{in}$ crosses the LTP, output voltage $V_{out}$ instantly changes from the L level to the H level. In the steady state, output voltage $V_{out}$ is obtained with its logic level inverted to that of input voltage $V_{in}$.

Figure 4:
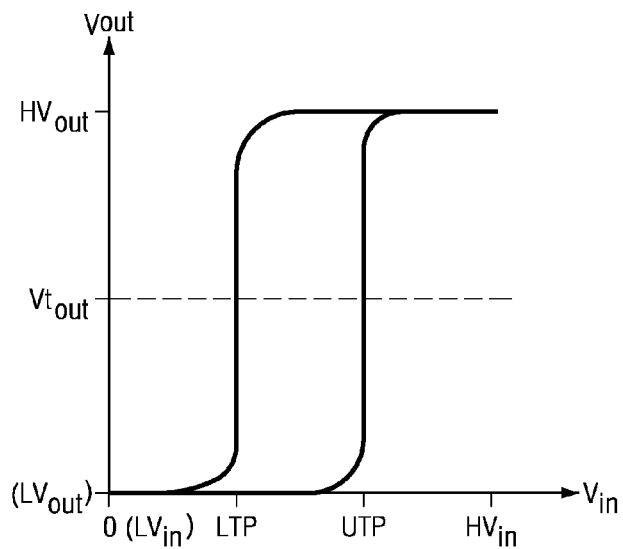
FIG. 4 is a diagram illustrating another example of hysteresis-type input/output transmission characteristic.

In the input/output characteristic shown in FIG. 4, when input voltage $V_{in}$ rises from the L level stable value $LV_{in}$ to the H level stable value $HV_{in}$, the UTP is the threshold, and, with input voltage $V_{in}$ originally lower than the UTP and output voltage $V_{out}$ at the L level, as input voltage $V_{in}$ rises above the UTP, output voltage $V_{out}$ instantly changes from the L level to the H level. When input voltage $V_{in}$ falls from H level stable value $HV_{in}$ to L level stable value $LV_{in}$, the LTP is the threshold, and, with input voltage $V_{in}$ originally higher than the LTP and output voltage $V_{out}$ at the H level, as input voltage $V_{in}$ crosses the LTP, output voltage $V_A$ instantly changes from the H level to the L level. In the steady state, output voltage $V_{out}$ is obtained with the same logic level as that of input voltage $V_{in}$.

In this way, in the input characteristic shown in FIG. 3 or 4, hysteresis circuit 10 performs a first output inversion operation such that output voltage $V_{out}$ is changed from the H level to the L level (FIG. 3) or from the L level to the H level (FIG. 4) at the UTP as input voltage $V_{in}$ rises from the L level to the H level, and it performs a second output inversion operation such that output voltage $V_{out}$ is changed from the L level to the H level (FIG. 3) or from the H level to the L level (FIG. 4) at the LTP as input voltage $V_{in}$ falls from the H level to the L level. The state in hysteresis circuit 10 (first state) when the first output inversion operation is performed and the state in hysteresis circuit 10 (second state) when the second output inversion operation is performed at the LTP are different from each other. At the UTP, after performing the first output inversion operation, a transition to the second state occurs. At LTP, after performing the second output inversion operation, a transition to the first state occurs. These transitions are not performed instantly, and there is a certain time-delay before completion.

Transmission control part 12 has transition-detecting part 14 that performs the following operation: in hysteresis circuit 10, each time said first output inversion operation or second output inversion operation is performed, immediately after the operation, the timing at which transition has been essentially completed to the second state or to the first state (hereinafter to be referred to as "transition-completion timing") is detected.

In the basic constitution shown in FIG. 1, transmission control part 12 has gate circuit 18 that controls signal transmission on signal transmission path 16 on the output side of hysteresis circuit 10. In this case, transition-detecting part 14 detects the timing of the start of the first output inversion operation or the second output inversion operation and the transition-completion timing according to the potential of a prescribed node other than the output node in hysteresis circuit 10. Gate circuit 18 receives a timing detection signal from transition-detecting part 14, essentially blocks signal transmission path 16 in order to prohibit or delay transmission of signal to the downstream circuit in the period from the timing of the start of the output inversion operation to the transition-completion timing, and, after the transition-completion timing, it sets signal transmission path 16 in the enable state, and re-starts signal transmission to the downstream circuit.

In the basic constitution shown in FIG. 2, transmission control part 12 has driver 20 that drives signal transmission path 16 on the output side of hysteresis circuit 10. In this case, transition-detecting part 14 detects the transition-completion timing according to the potential of the output node, that is, output signal, $V_{out}$, in hysteresis circuit 10. Driver 20 receives a timing detection signal from transition-detecting part 14, and, corresponding to output signal $V_{out}$ of hysteresis circuit 10 after the transition-completion timing, it drives the potential on signal transmission path 16 on the downstream side to the H level or L level.

The basic constitutions shown in FIGS. 1 and 2 are merely examples of the present invention. The present invention may have other embodiments. For example, in the basic constitution shown in FIG. 1, one may replace gate circuit 18 of transmission control part 12 with driver 20.

In the hysteresis-type input circuit of the present invention, when a normal output inversion operation is started upon input voltage $V_{in}$ reaching the LTP or UTP, even if a glitch (especially a glitch running near the LTP or UTP) is contained in input voltage $V_{in}$ during the transition time before transition to the next stable state has been essentially completed, the glitch can be entirely disregarded or masked, and it is possible to prevent transmission of a desired pulse to the downstream circuit with high reliability.

Embodiment 1

Figure 5:
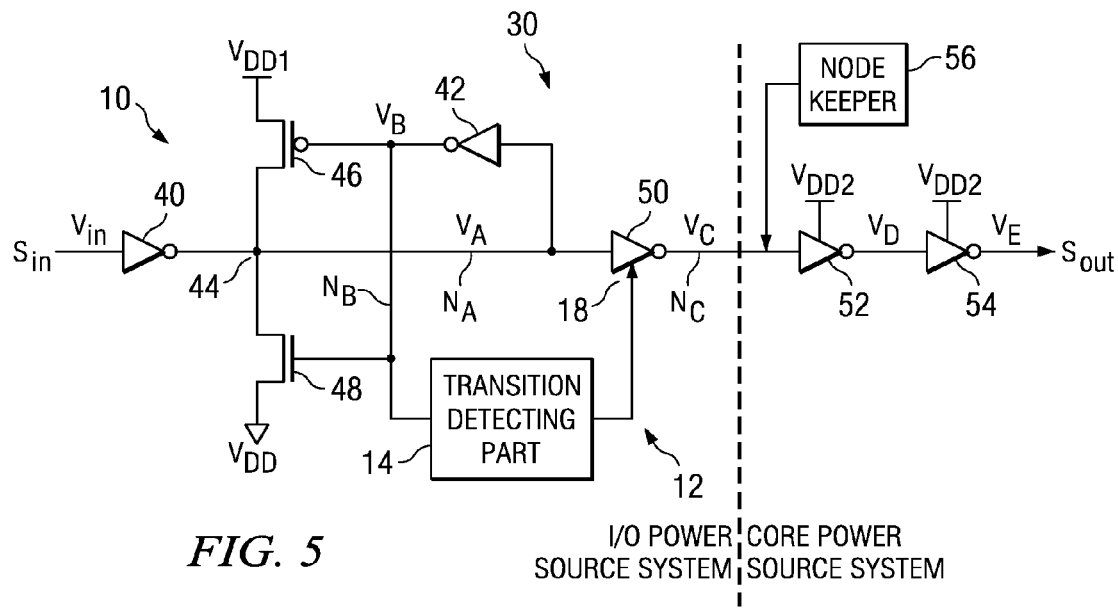
FIG. 5 is a diagram illustrating the circuit constitution of the hysteresis-type input circuit in an embodiment of the present invention.

FIG. 5 is a diagram illustrating the circuit constitution of hysteresis-type input circuit 30 in an embodiment of the present invention. This input circuit 30, for example, is set in IO circuit 38 on the periphery of core circuit 36 at the center portion of semiconductor chip 34 of the digital IC shown in FIG. 6, and it acts as a receiver circuit for input of digital signal $S_{in}$ from the outside.

As shown in FIG. 5, hysteresis circuit 10 in this embodiment is composed of three inverters 40, 42, 44. Inverter 40 has input signal $S_{in}$ input to its input terminal, and has its output terminal connected to node $N_A$. Inverter 42 has its input terminal connected to node $N_A$ and its output terminal connected to node $N_B$. Inverter 44 has its input terminal connected to $N_B$ and its output terminal connected to node $N_A$.

Inverter 44 is composed of pMOS transistor 46 and nMOS transistor 48. pMOS transistor 46 has its source terminal connected to the terminal of power source voltage $V_{DD1}$ on the positive electrode side, its drain terminal connected to node $N_A$, and its gate terminal connected to node $N_B$. nMOS transistor 48 has its source terminal connected to the terminal of power source voltage $V_{SS}$ (conventional ground potential) on the negative electrode side, its drain terminal connected to node $N_A$, and its gate terminal connected to node $N_B$. As will be explained later, the current-driving abilities of said pMOS transistor 46 and nMOS transistor 48 are related to the hysteresis characteristic of hysteresis circuit 10.

Figure 7:
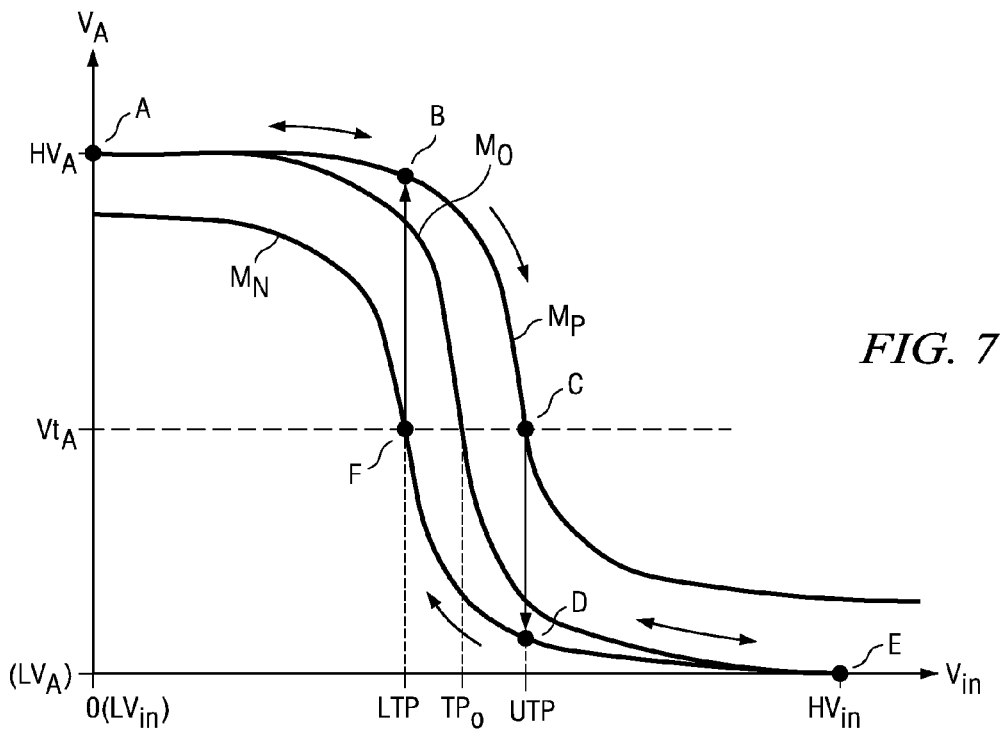
FIG. 7 is a diagram illustrating the input/output characteristic of the hysteresis circuit contained in the hysteresis-type input circuit of the embodiment.

FIG. 7 is a diagram illustrating the input/output characteristic of said hysteresis circuit 10 in said embodiment. The input/output characteristic in this case is of the type shown in FIG. 3 (input/output inversion type). Solid curve $M_O$ shows the input/output characteristic of hysteresis circuit 10 excluding inverter 44 (as a result, inverter 42 is also excluded), that is, the input/output characteristic of inverter 40. In said input/output characteristic $M_O$, trip point $TP_0$ corresponds to the inversion threshold of inverter 40. Dot-dash curve $M_P$ shows the input/output characteristic of hysteresis circuit 10 with only nMOS transistor 48 of inverter 44 excluded. The trip point in said input/output characteristic $M_P$ is upper trip point UTP of hysteresis circuit 10, and the hysteresis width in this case (UTP–$TP_0$) is determined by the current-driving ability of pMOS transistor 46. Double-dot-dash curve MN shows the input/output characteristic when only pMOS transistor 46 of inverter 44 is excluded from hysteresis circuit 10. The trip point of said input/output characteristic $M_N$ is lower trip point LTP of hysteresis circuit 10. The hysteresis width in this case (TP0–LTP) is determined by the current-driving ability of nMOS transistor 48.

According to the input/output characteristic shown in FIG. 7, when input voltage $V_{in}$ rises from stable value $LV_{in}$ of the L level to stable value $HV_{in}$ of the H level, output voltage $V_A$ changes as A→B→C→D→E. In this case, before input voltage $V_{in}$ reaches the UTP, in input/output characteristic $M_P$, output voltage $V_A$ varies (A→B→C). Then, at about the time input voltage $V_{in}$ reaches the UTP, output voltage $V_A$ falls rapidly from the H level through inversion threshold value $Vt_A$ to the L level, and there is a jump from input/output characteristic $M_P$ to input/output characteristic $M_N$ (C→D). Then, in input/output characteristic $M_N$, output voltage $V_A$ falls to stable value $LV_A$ (D→E). Inversion threshold $Vt_A$ is the threshold when output inversion operation is performed for inverters 42, 50 that have the output voltage or node voltage $V_A$ input to them (FIG. 5).

When input voltage $V_{in}$ falls from stable value $HV_{in}$ of the H level to stable value $LV_{in}$ of the L level, output voltage $V_A$ changes as E→D→F→B→A. In this case, until input voltage $V_{in}$ reaches UTP, output voltage $V_A$ changes along input/output characteristic $M_N$. Then, around the time input voltage $V_{in}$ reaches the LTP, output voltage $V_A$ rapidly rises from the L level through inversion threshold $Vt_A$ to the H level, and there is a jump from input/output characteristic $M_N$ to input/output characteristic $M_P$ (F→B). Then, with input/output characteristic $M_P$, output voltage $V_A$ rises to stable value $HV_A$ (B→A).

In hysteresis circuit 10 in this embodiment, when the first output inversion operation is performed with output voltage $V_A$ inverted from the H level to the L level at the UTP, that is, in the first state, in inverter 44, pMOS transistor 46 is ON, while nMOS transistor 48 is OFF. On the other hand, when the second output inversion operation is performed, with output voltage $V_A$ inverted from the L level to the H level at the LTP, that is, in the second state, in inverter 44, pMOS transistor 46 is OFF, while nMOS transistor 48 is ON.

Then, after performing the first output inversion operation ($V_A$: H→L) at the UTP, transition to the second state occurs (the state in which in inverter 44, pMOS transistor 46 is OFF, while nMOS transistor 48 is ON). When said transition comes close to point E (stable value) on input/output characteristic $M_N$, that is, when the potential of node $N_B$ comes very close to $V_{DD1}$, the operation comes to an end. Also, after performing the second output inversion operation ($V_A$: L→H) at LTP, transition to the first state occurs (the state in which for inverter 44, pMOS transistor 46 is ON, while nMOS transistor 48 is OFF). When said transition comes close to point A (stable value) on input/output characteristic $M_P$, that is, when the potential of node $N_B$ comes very close to $V_{SS}$, the operation comes to an end.

From another viewpoint, when the first output inversion operation ($V_A$: H→L) is performed at the UTP, the effective operation point of the trip point in hysteresis circuit 10 shifts from the UTP to the LTP. This transition is performed as a floating LTP' that allows the same abnormal output inversion operation as the second output inversion operation moves (falls) from the position (value) of the UTP to the position (value) of the LTP, and, when the LTP' reaches the LTP, the operation comes to an end. In this way, the transition from the UTP to the LTP of the effective operation point of said trip point corresponds to the transition to the second state immediately after said first output inversion operation.

Also, when the second output inversion operation ($V_A$: L→H) is performed at LTP, the effective operation point of the trip point in hysteresis circuit 10 undergoes transition from the LTP to the UTP. This transition is performed as a floating UTP' that allows the same abnormal output inversion operation as the first output inversion operation undergoes transition (rises) from the position (value) of the LTP to the position (value) of the UTP, and, when the UTP' reaches the UTP, the operation comes to an end. Said transition of the effective operation point of the trip point from the LTP to the UTP corresponds to the transition to the first state immediately after said second output inversion operation.

As shown in FIG. 5, node $N_B$ in hysteresis circuit 10 is connected to the input terminal of transition-detecting part 14 of transmission control part 12. Transition-detecting part 14 can detect the timing of the start of the output inversion operation and the timing of transition-completion in hysteresis circuit 10 corresponding to potential $V_B$ of node $N_B$.

For the basic constitution shown in FIG. 1, gate circuit 18 of transmission control part 12 may be set on the signal transmission path connected to output node $N_A$ Of hysteresis circuit 10, such as inside, upstream or downstream of inverter 50 of the IO power source system ($V_{DD1}$: such as 1.8 V). In this embodiment, in addition, inverters 52, 54 of the core power source system ($V_{DD2}$: such as 1.1 V) are connected as two cascade stages in the downstream of inverter 50. Also, one may set node keeper 56 for preventing a floating state of the signal transmission path at an appropriate position on the signal transmission path, such as between inverter 50 and inverter 52.

Figure 8:
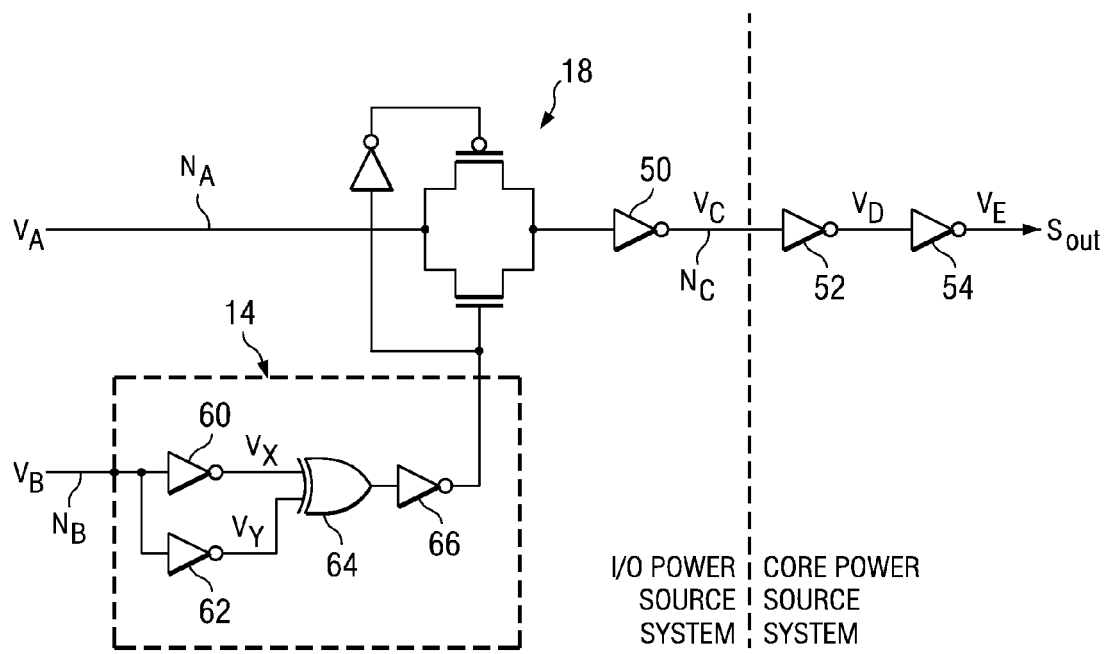
FIG. 8 is a diagram illustrating an example constitution of the transmission control part in the embodiment.

FIG. 8 is a diagram illustrating a specific example constitution of transition-detecting part 14 and gate circuit 18 of transmission control part 12. Transition-detecting part 14 has the following components: a pair of inverters 60, 62 having their input terminals connected to node $N_B$ of hysteresis circuit 10, exclusive-OR (EXOR) circuit 64 that performs computation of the exclusive-OR for output voltages $V_X$ and $V_Y$ of inverters 60, 62, and inverter 66 that performs inversion for the output of said EXOR circuit 64.

Figure 9A:
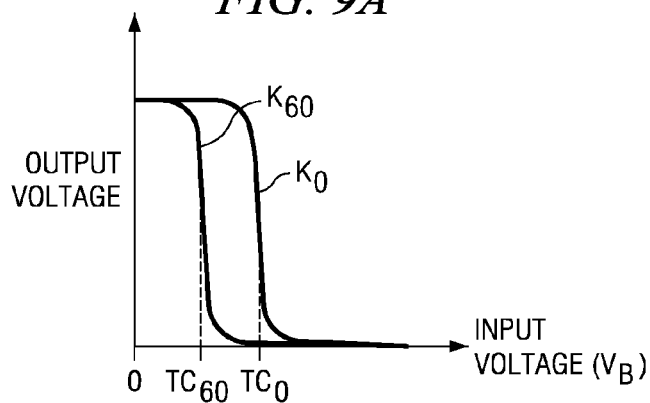
FIG. 9 is a diagram illustrating the input/output characteristic of the inverter for detecting transition and contained in the transmission control part of the embodiment.

Inverters 60, 62 have the input/output characteristics shown in FIGS. 9(A), (B), respectively. In FIG. 9(A), threshold $TC_{60}$ in the input/output characteristic (solid curve $K_{60}$) of inverter 60 is much lower than threshold $TC_0$ of the input/output characteristic of a conventional inverter (dot-dash curve $K_0$), and it is set near the LTP of hysteresis circuit 10 (or preferably a value smaller than the LTP). Inverter input/output characteristic $K_{60}$ having said rather small threshold $TC_{60}$ can be realized by adjusting the balance of the current-driving ability of the pMOS transistor and nMOS transistor that form inverter 60 (that is, by having that of the nMOS side higher than that of the pMOS side).

Figure 9B:
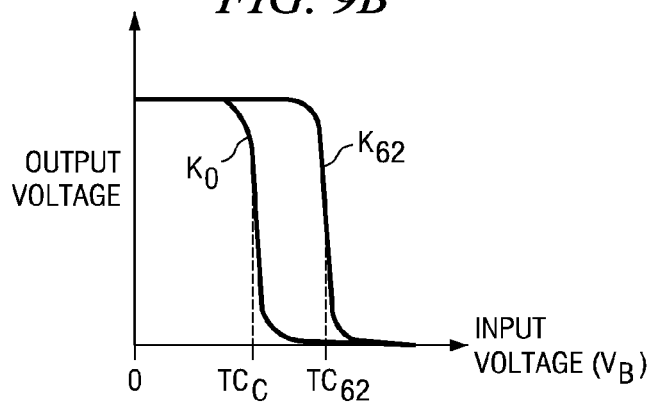

On the other hand, in FIG. 9(B), threshold $TC_{62}$ in the input/output characteristic (solid curve $K_{62}$) of inverter 62 is significantly higher than threshold $TC_0$ of the conventional inverter input/output characteristic (dot-dash curve $K_0$), and it is set at a value near the UTP of hysteresis circuit 10 (preferably a value larger than the UTP). Said inverter input/output characteristic $K_{62}$ having a rather high threshold $TC_{62}$ can be realized by adjusting the balance in the current-driving ability of the pMOS transistor and nMOS transistor that form inverter 62 (by having that of the pMOS side higher than that of the nMOS side).

In the example of the constitution shown in FIG. 8, gate circuit 18 consists of a transmission gate. When the output of transition-detecting part 14 is at the H level, said transmission gate 18 is ON, so that voltage signal $V_A$ on node $N_A$ is transmitted to the input terminal of inverter 50. When the output of transition-detecting part 14 is at the L level, transmission gate 18 is OFF, and, in the high-impedance state, voltage signal $V_A$ on node $N_A$ is cut off.

Figure 10:
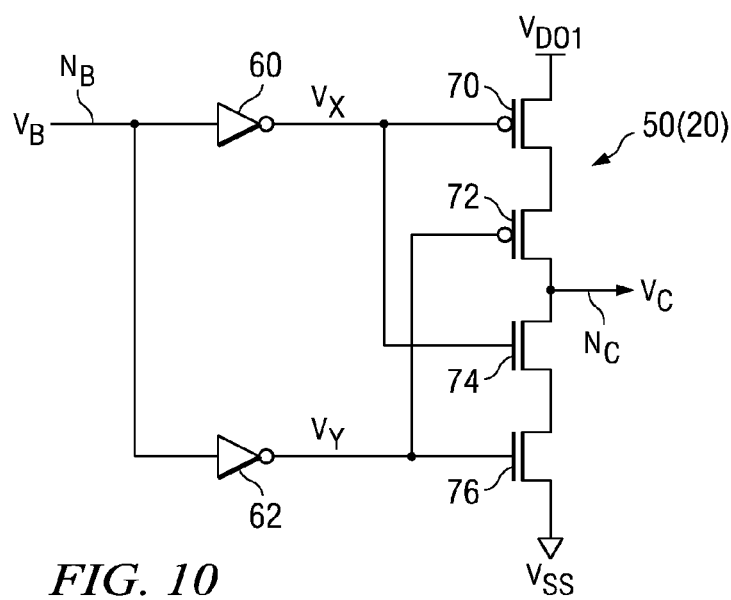
FIG. 10 is a diagram illustrating another example constitution of the transmission control part of the embodiment.

FIG. 10 is a diagram illustrating another example constitution of transmission control part 12. In this example constitution, which corresponds to the basic constitution shown in FIG. 2, transition-detecting part 14 is composed of only said initial inverters 60, 62, and driver 20 consists of inverter 50. In this case, inverter 50 is composed of two pMOS transistors 70, 72 connected in series between the terminal of power source voltage $V_{DD1}$ on the positive electrode side and output-side node $N_C$, and two nMOS transistors 74, 76 connected in series between output-side node $N_C$ and the terminal of power source voltage $V_{SS}$ on the negative electrode side. The output terminal of inverter 60 is connected to the gate terminals of pMOS transistor 70 and nMOS transistor 74, and the output terminal of inverter 62 is connected to the gate terminals of pMOS transistor 72 and nMOS transistor 76. In this example constitution, node $N_B$ of hysteresis circuit 10 acts as both a monitor node and an output node, and it is connected to the input terminal of transition-detecting part 14 (inverters 60, 62). Transmission control part 12 has the advantage that since the number of structural members is less, the time-delay of the operation is shorter.

In the following, operation of hysteresis-type input circuit 30 in this embodiment will be explained with reference to the waveform figures shown in FIGS. 11 and 12.

Figure 11A:
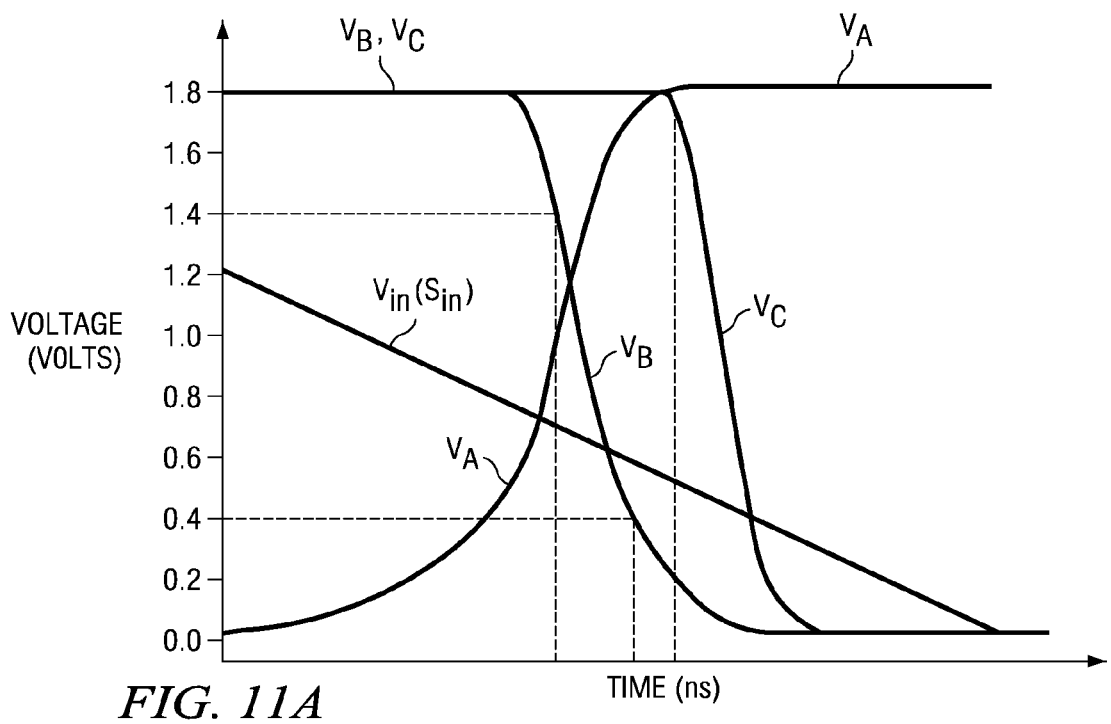
FIG. 11 is a signal waveform diagram illustrating the operation in the hysteresis-type input circuit of the embodiment (operation without a glitch).
Figure 11B:
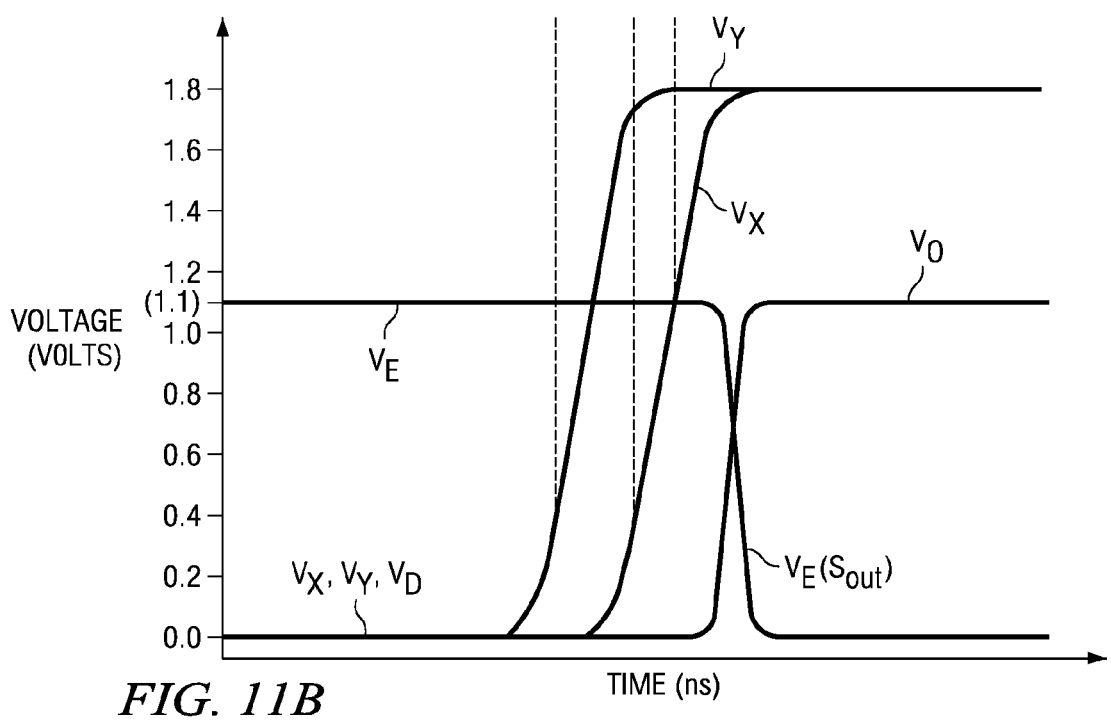

FIG. 11 is a diagram illustrating operation without a glitch rising during falling of input voltage $V_{in}$ from the H level to the L level. In this case, when input voltage $V_{in}$ crosses the LTP (about 0.8 V), potential $V_B$ of node $N_B$ in hysteresis circuit 10 starts falling from the level (1.8 V) of power source voltage $V_{DD1}$, and it quickly falls towards the level (0 V) of power source voltage $V_{SS}$. Potential $V_A$ of node $N_A$ also rises rapidly from near the level of $V_{SS}$ towards the level (1.8 V) of $V_{DD1}$, and it is inverted during this from the L level to the H level. In inverter 44 of hysteresis circuit 10, there is a transition from the state (second state) in which nMOS transistor 48 is ON and pMOS transistor 46 is OFF to the state (first state) in which nMOS transistor 48 is OFF and pMOS transistor 46 is ON.

In transmission control part 12, potential $V_B$ of node $N_B$ of hysteresis circuit 10 is input to inverters 60, 62 of transition-detecting part 14. Before input voltage $V_{in}$ falls from the H level to the L level, potential $V_B$ of node $N_B$ is kept at the $V_{DD1}$ level. Consequently, outputs of both inverters 60, 62 are at the L level. Consequently, in the example constitution shown in FIG. 8, in transition-detecting part 14, the output of EXOR circuit 64 is at the L level, and the output of inverter 66 is at the H level. Consequently, transmission gate 18 on the signal transmission path is ON, and voltage $V_A$ of node $N_A$ is input or transmitted to inverter 50. In the example constitution shown in FIG. 10, in inverter 50, both pMOS transistors 70, 72 are turned ON, and both nMOS transistors 74, 76 are turned OFF, and output-side $N_C$ is driven to the level of $V_{DD1}$.

As explained above, when voltage $V_{in}$ falls from the H level to the L level, node potential $V_B$ of hysteresis circuit 10 crosses threshold $TC_{62}$ (about 1.4 V) of inverter 62, and at this timing, output voltage $V_Y$ of inverter 62 rapidly rises from the $V_{SS}$ level (0 V) to the $V_{DD1}$ level (about 1.8 V).

In the example constitution shown in FIG. 8, the output of EXOR circuit 64 in transition-detecting part 14 is changed from the H level to the L level, and the output of inverter 66 is changed from the L level to the H level. As a result, on the signal transmission path, transmission gate 18 is turned OFF, and transmission of voltage $V_A$ of node $N_A$ to inverter 50 is stopped or prohibited.

In the example constitution shown in FIG. 10, while output $V_X$ of inverter 60 is at the L level, output $V_Y$ of inverter 62 is changed from the L level to the H level. As a result, in inverter 50, pMOS transistor 70 and nMOS transistor 76 are turned ON, and pMOS transistor 72 and nMOS transistor 74 are turned OFF. Consequently, output-side node $N_C$ enters the high-impedance state.

When node potential $V_B$ of hysteresis circuit 10 further falls and crosses threshold $TC_{60}$ (about 0.4 V) of inverter 60, at said timing, output voltage $V_X$ of inverter 60 rapidly rises from $V_{SS}$ level (0 V) to the $V_{DD1}$ level (1.8 V). As a result, output voltages $V_X$ and $V_Y$ of inverters 60, 62 both reach the H level.

As a result, in the example constitution shown in FIG. 8, the output of EXOR circuit 64 in transition-detecting part 14 changes from the H level to the L level, and the output of inverter 66 changes from the L level to the H level. Consequently, on the signal transmission path, transmission gate circuit 18 is ON, and transmission of voltage $V_A$ of node $N_A$ to inverter 50 is re-started. In this way, when voltage $V_A$ of node $N_A$ is input via transmission gate 18 to inverter 50, because $V_A$ is already over inversion threshold $Vt_A$ (about 1.0 V), inverter 50 immediately performs an output inversion operation, and output voltage $V_C$ is inverted from the hitherto $V_{DD1}$ level (1.8 V) to the $V_{SS}$ level (0 V). Corresponding to this operation, inverters 52, 54 of the downstream core power source system also perform output inversion operation as a chain, output voltage $V_D$ of inverter 52 is inverted from the $V_{SS}$ level (0 V) to the $V_{DD2}$ level (1.1 V), and output voltage $V_E$ of inverter 54 is inverted from the $V_{DD2}$ level (1.1 V) to the $V_{SS}$ level (0 V). Also, in FIG. 11, in order to facilitate explanation, the time-delay of transition-detecting part 14 in the example constitution shown in FIG. 8 is ignored.

In the example constitution shown in FIG. 10, as explained above, when output voltages $V_X$, $V_Y$ of both inverters 60, 62 reach the H level, in inverter 50, both pMOS transistors 70, 72 are turned OFF, and both nMOS transistors 74, 76 are turned ON, and output-side node $N_C$ is driven to the level of $V_{SS}$. Corresponding to this operation, inverters 52, 54 of the downstream core power source system also perform output inversion operations as a chain. Output voltage $V_D$ of inverter 52 is inverted from the $V_{DD2}$ level (1.1 V) to the $V_{SS}$ level (0 V), and output voltage $V_E$ of inverter 54 is inverted from the $V_{SS}$ level (0 V) to the $V_{DD2}$ level (1.1 V).

Figure 12A:
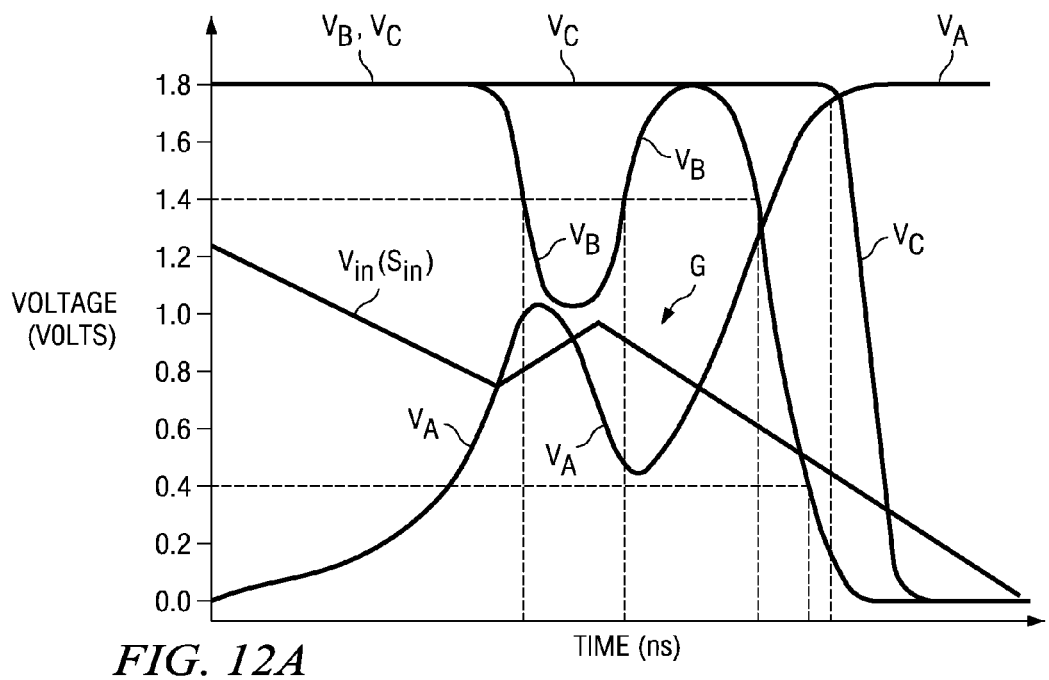
FIG. 12 is a signal waveform diagram illustrating the operation in the hysteresis-type input circuit of the embodiment (operation with a glitch).
Figure 12B:
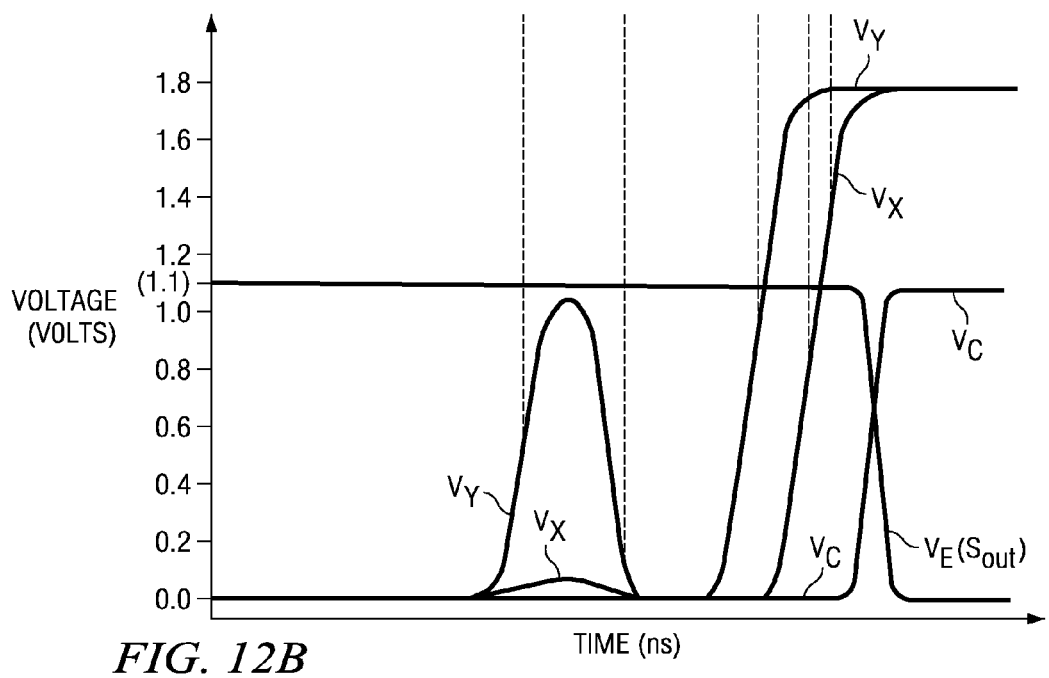

FIG. 12 is a diagram illustrating operation in case glitch G rides near the LTP as input voltage $V_{in}$ falls from the H level to the L level. In this case, too, when input voltage $V_{in}$ passes the LTP (about 0.8 V), potential $V_B$ of node $N_B$ in hysteresis circuit 10 quickly falls from the $V_{DD1}$ level (1.8 V), and potential $V_A$ of node $N_A$ rises quickly towards the $V_{DD1}$ level (1.8 V). However, due to zigzag glitch G, immediately after input voltage $V_{in}$ crosses the LTP, it turns to rise and then soon returns to falling, and it falls to the $V_{SS}$ level (0 V). In this way, following the zigzag waveform of glitch G or $V_{in}$, potential $V_B$ of node $N_B$ first falls rapidly and then stops halfway, and it turns back to rise near the $V_{DD1}$ level ($1.8$ V). Then, it turns to fall, and it falls to the $V_{SS}$ level (0 V). Also, potential $V_A$ Of node $N_A$ stops the initial rapid rise and it returns to falling, followed by rising again, and it rises to the $V_{DD1}$ level (1.8 V).

In transmission control part 12, when potential $V_B$ of node $N_B$ in hysteresis circuit 10 crosses threshold $TC_{62}$ (about 1.4 V) of inverter 62, at this time, output voltage $V_Y$ of inverter 62 rapidly rises from near the $V_{SS}$ level (0 V). However, as explained above, because potential $V_B$ of node $N_B$ immediately turns from falling to rising, and rises above threshold $TC_{62}$ (about 1.4 V), output voltage $V_Y$ of inverter 62 turns from rapid rising to rapid falling, and it returns to the $V_{SS}$ level (0 V).

In the case of the example constitution shown in FIG. 8, when output voltage $V_Y$ of inverter 62 is inverted from the L level to the H level, transmission gate 18 is turned OFF, and transmission of potential $V_A$ of node $N_A$ is cut off. However, because output voltage $V_Y$ of inverter 62 returns from the H level to the L level, transmission gate 18 is turned ON, and transmission of potential $V_A$ of node $N_A$ is re-started. At this time, potential $V_A$ returns to below inversion threshold $Vt_A$, and inverter 50 maintains output potential $V_C$ at the hitherto H level. In the example constitution shown in FIG. 10, when output voltage $V_Y$ is inverted from the L level to the H level, output-side node $N_C$ of inverter 50 is instantly placed into the high-impedance state. Then, when output voltage $V_Y$ of inverter 62 returns from the H level to the L level, inverter 50 also returns to the previous state, and output-side node $N_C$ is driven to the $V_{DD1}$ level (1.8 V).

Then, as potential $V_B$ of node $N_B$ falls again and falls to the $V_{SS}$ level (0 V), it crosses threshold $TC_{62}$ (about 1.4 V) of inverter 62. At this timing, once again, inverter 62 performs an output inversion operation, and output voltage $V_Y$ is inverted from the L level to the H level. Then, as potential $V_B$ of node $N_B$ crosses threshold $TC_{60}$ (about 0.4 V) of inverter 60, at this timing, inverter 60 performs an output inversion operation, and output voltage $V_X$ is inverted from the L level to the H level.

In the example constitution shown in FIG. 8, once again, output potential $V_Y$ of inverter 62 is inverted from the L level to the H level, and, corresponding to this operation, transmission gate 18 is turned OFF, and transmission of potential $V_A$ of node $N_A$ is cut off. Then, when output voltage $V_X$ of inverter 60 is inverted from the L level to the H level, transmission gate 18 is turned ON, and transmission of potential $V_A$ of node $N_A$ is re-started. At this time, because potential $V_A$ of node $N_A$ is already over threshold $Vt_A$, inverter 50 immediately performs an output inversion operation, and output voltage $V_C$ falls from $V_{DD1}$ (1.8 V) to the $V_{SS}$ level (0 V). As a result, inverters 52, 54 of the downstream core power source system also perform output inversion operations as a chain, output voltage $V_D$ of inverter 52 is inverted from the $V_{SS}$ level (0 V) to the $V_{DD2}$ level (1.1 V), and output voltage $V_E$ of inverter 54 is inverted from the $V_{DD2}$ level (1.1 V) to the $V_{SS}$ level (0 V).

In the example constitution shown in FIG. 10, once again, output voltage $V_Y$ of inverter 62 is inverted from the L level to the H level, and, in inverter 50, pMOS transistor 70 and nMOS transistor 76 are turned ON, pMOS transistor 72 and nMOS transistor 74 are turned OFF, and output-side node $N_C$ enters the high-impedance state. Then, immediately, output voltage $V_X$ of inverter 60 is inverted from the L level to the H level, and, in inverter 50, both pMOS transistors 70, 72 are turned OFF, both nMOS transistors 74, 76 are turned ON, and output-side node $N_C$ is driven to the $V_{SS}$ level (0 V). As a result, in inverters 52, 54 of the downstream core power source system, output inversion operations are performed as a chain, output voltage $V_D$ of inverter 52 is inverted from the $V_{SS}$ level (0 V) to the $V_{DD2}$ level (1.1 V), and output voltage $V_E$ Of inverter 54 is inverted from the $V_{DD2}$ level (1.1 V) to the $V_{SS}$ level (0 V).

As explained above, when input voltage $V_{in}$ falls from the H level to the L level, in hysteresis circuit 10, the second inversion output operation is performed at the LTP, and, at a timing at which until potential $V_B$ of node $N_B$ goes below threshold $TC_{60}$ of inverter 60 in transition-detecting part 14 of transmission control part 12, output signal $V_A$ of hysteresis circuit 10 is not transmitted to the downstream circuit, and gate circuit 18 of transmission control part 12 or driver 20 is essentially cut off. After said timing, output signal $V_A$ of hysteresis circuit 10 is transmitted to the downstream circuit. As a result, even when a glitch rides on the falling waveform of input voltage $V_{in}$, a pulse waveform free of the noise pulse can still be output or transmitted to the downstream circuit.

Figure 13A:
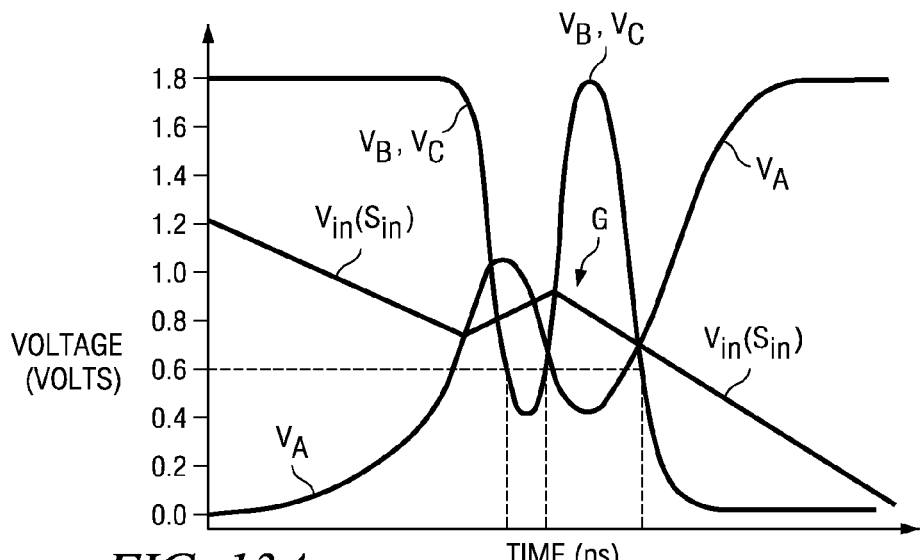
FIG. 13 is a signal waveform diagram illustrating the operation in the hysteresis-type input circuit of a reference example (operation with a glitch).
Figure 13B:
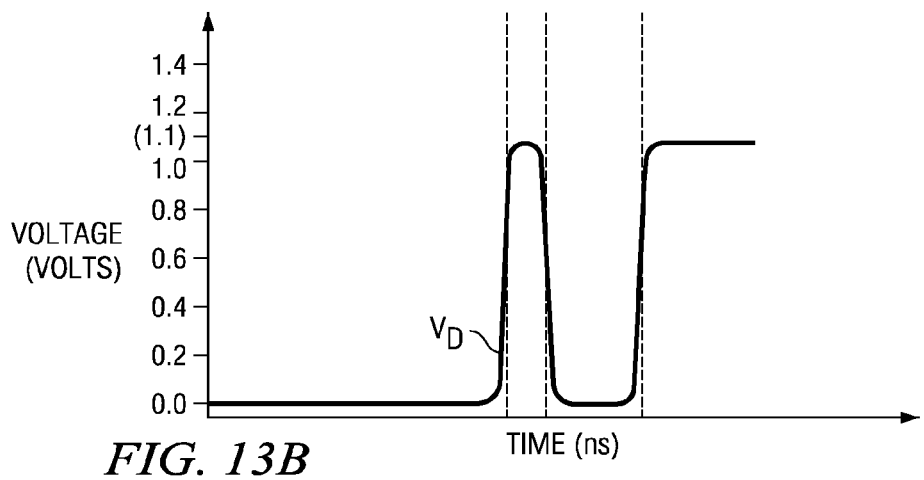
Figure 13C:
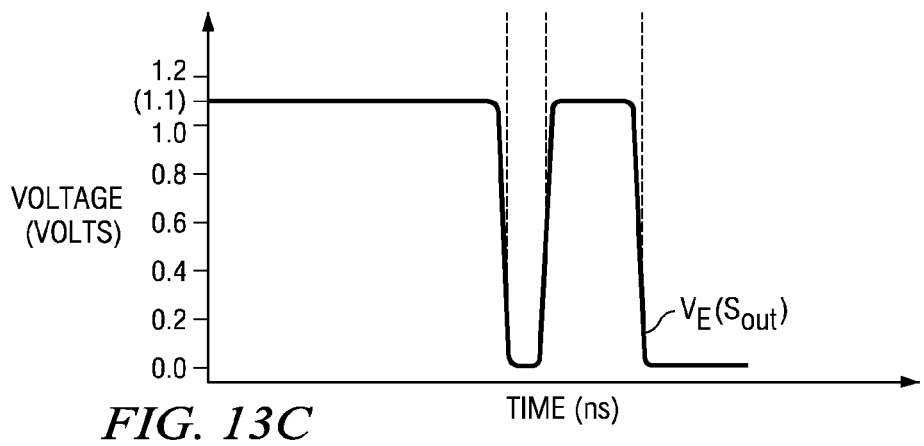

In FIG. 13, as a reference (Comparative Example), transmission control part 12 from hysteresis-type input circuit 30 in FIG. 5 is omitted, and the operation with input voltage $V_{in}$ having the same glitch G as aforementioned is displayed. In this case, because transmission control part 12 is not connected to node $N_B$, the load of inverter 42 decreases. As a result, potential $V_B$ of node $N_B$ varies faster and the change is significant. In order to facilitate explanation, inverter 50 is assumed to work with the same load as that of inverter 42, and potential $V_C$ of output-side node $N_C$ of inverter 50 deemed to vary with the same values as those of potential $V_B$ of node $N_B$.

As shown in FIG. 13, when there is no transmission control part 12, potential $V_A$ of node $N_A$ tracks glitch G, and it is input or transmitted to inverter 50 as is, so that inverter 50, and then downstream inverters 52, 54 also operate corresponding to glitch G in the output inversion operation, and glitch pulse np appears as noise on the waveform of output $S_{out}$.

When input voltage $V_{in}$ rises from the L level to the H level, except for the LTP being replaced by the UTP in the operation in the various portions, the operation is the same as that explained above. For example, when hysteresis circuit 10 starts the first output inversion operation at the UTP, by means of transmission control part 12, output $V_X$ of inverter 60 is inverted from the H level to the L level. Then, when transition to the second state has been essentially completed after the first output inversion operation in hysteresis circuit 10, by means of transmission control part 12, output $V_X$ of inverter 60 is delayed, and the timing of completion of transition when output $V_Y$ of inverter 62 is inverted from the H level to the L level is detected. At this timing, variation in the output of hysteresis circuit 10 is transmitted to the downstream circuit.

Embodiment 2

Figure 14:
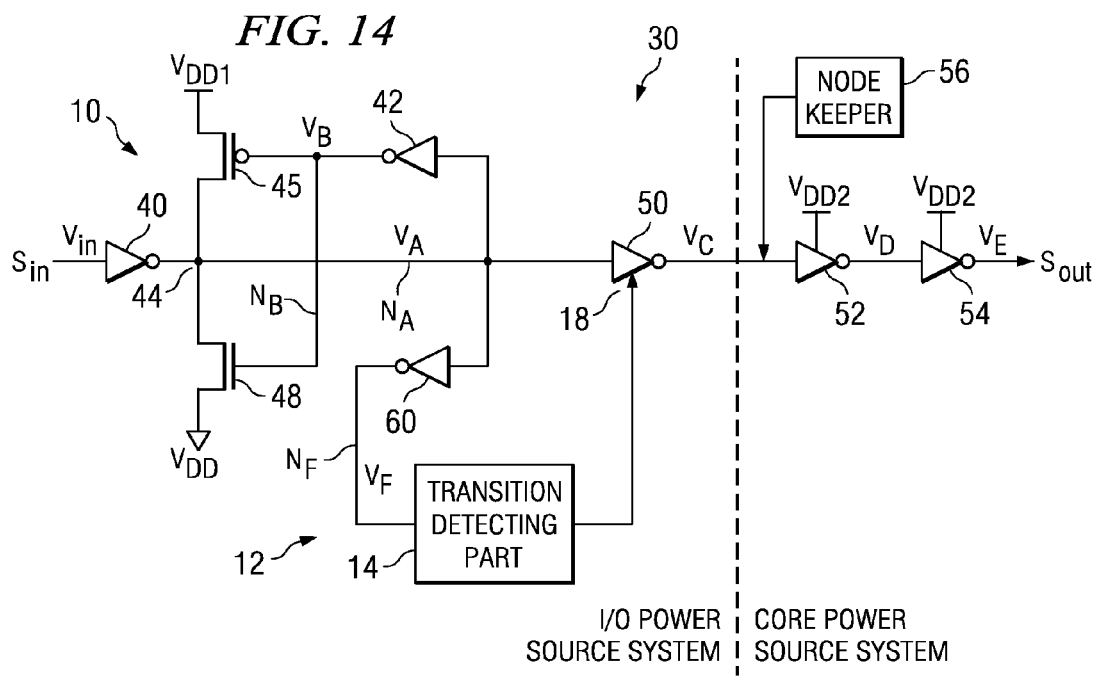
FIG. 14 is a diagram illustrating the circuit constitution of a hysteresis-type input circuit in another embodiment of the present invention.
Figure 15:
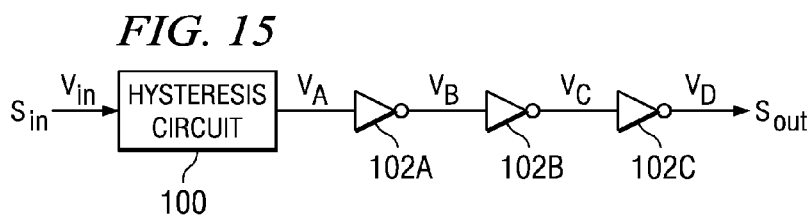
FIG. 15 is a diagram illustrating the basic constitution of a hysteresis-type input circuit in the prior art.
Figure 16:
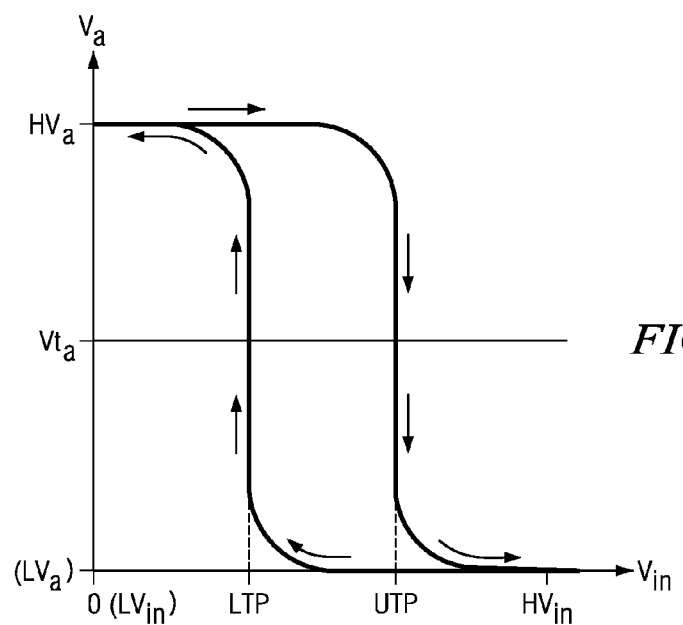
FIG. 16 is a diagram illustrating the input/output characteristic of the hysteresis circuit contained in the hysteresis-type input circuit shown in FIG. 15.
Figure 17A:
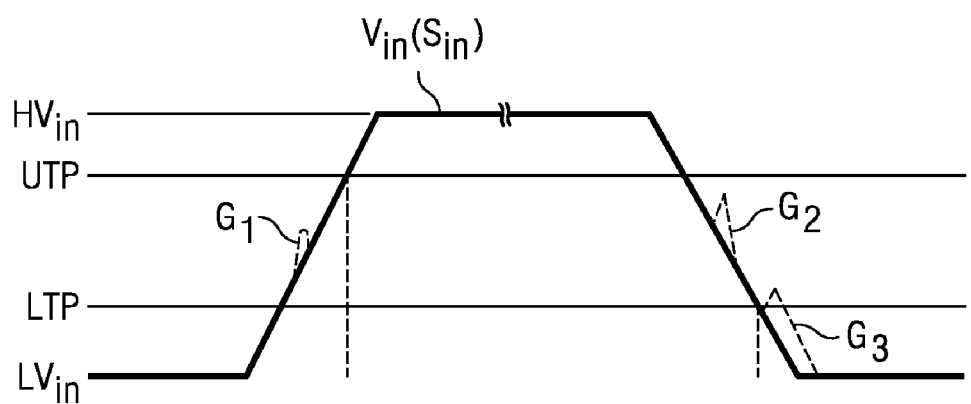
FIG. 17 is a diagram illustrating the operation of the hysteresis-type input circuit shown in FIG. 15 (operation when a glitch is not a problem).
Figure 17B:
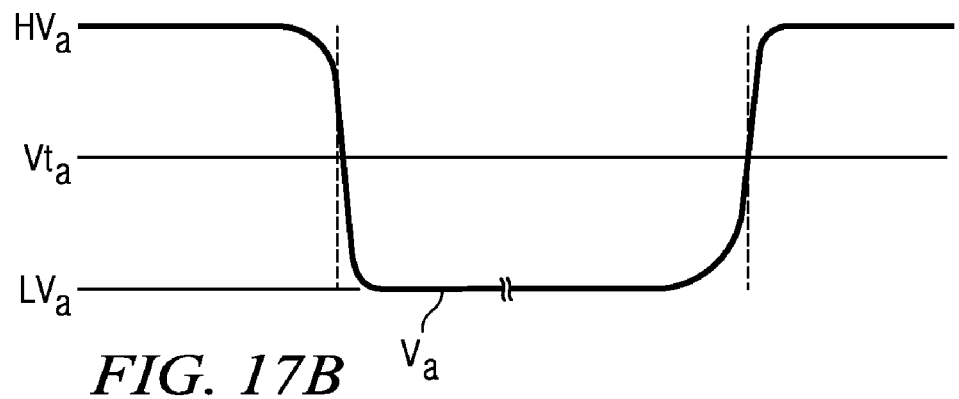
Figure 17C:
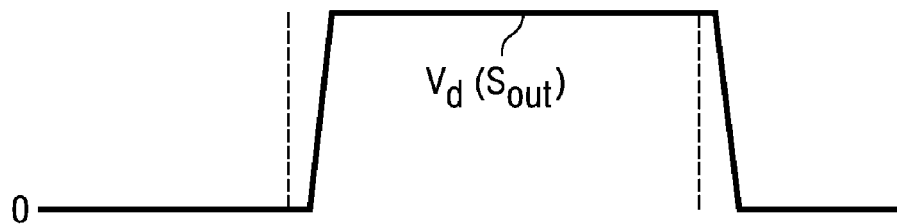
Figure 18:
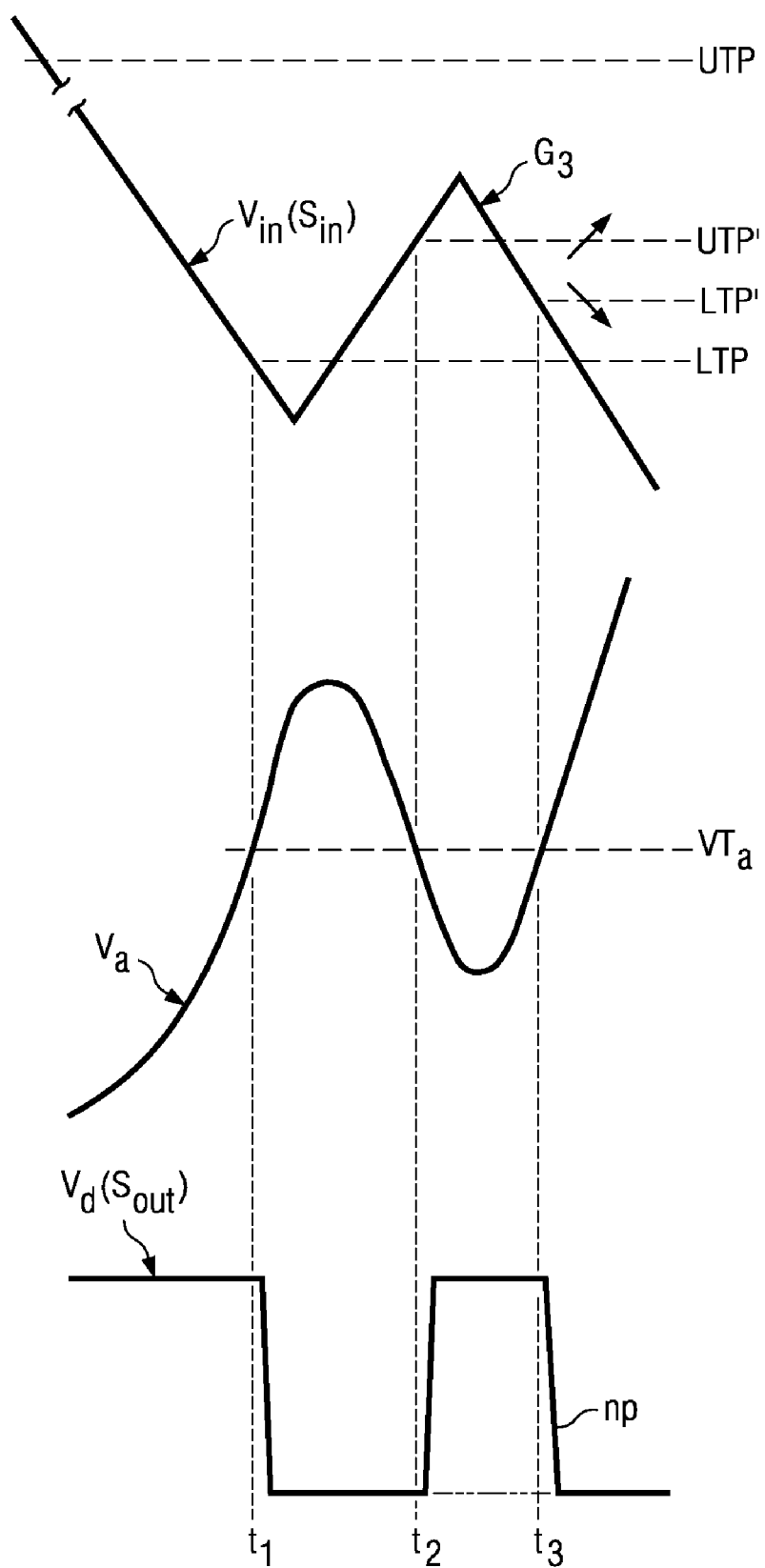
FIG. 18 is a diagram illustrating the operation of the hysteresis-type input circuit shown in FIG. 15 (operation when a glitch is a problem).

FIG. 14 is a diagram illustrating the constitution of hysteresis-type input circuit 30 in Embodiment 2 of the present invention. In Embodiment 2, node $N_A$ in the hysteresis-type input circuit (FIG. 5) in said Embodiment 1 is connected to the input terminal of inverter 80, and the output terminal of inverter 80 is connected to the input terminal of transmission control part 12. Here, it is preferred that inverter 80 be designed with the same circuit constant as that of inverter 42. Also, the following scheme is preferred: the load connected to output node $N_F$ of inverter 80 (transmission control part 12) is definitely higher than the load on the side of node $N_B$ (inverter 44), and potential $V_F$ of node $N_F$ is designed to change, with certainty, slower than potential $V_B$ of node $N_B$.

In Embodiment 2, by reducing the load of node $N_B$, after the output inversion operation in hysteresis circuit 10, it is possible to increase the speed of transition to the first or second state. More strictly speaking, because the load of node $N_A$ is increased, there is a definite increase in the signal transmission delay, yet there is no influence on the relative timing relationship between the transition in hysteresis circuit 10 and the delay in transmission to the downstream circuit.

Figure 6:
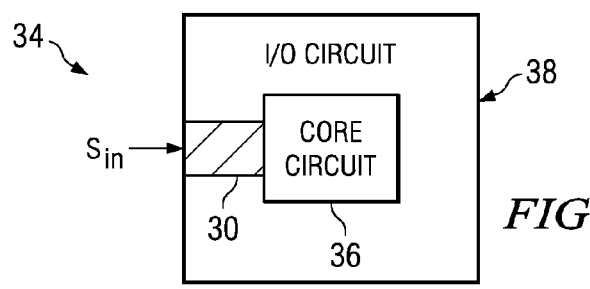
FIG. 6 is a diagram illustrating an application example of the hysteresis-type input circuit of the embodiment.

In addition, as a modified example, one may omit inverter 80 and have node $N_A$ directly connected to the input terminal of transmission control part 12. The embodiment shown in FIG. 6 is merely an example, and the hysteresis-type input circuit of the present invention can be used in any digital circuit or digital signal processing.

While the invention has been shown and described with reference to preferred embodiments thereof, it is well understood by those skilled in the art that various changes and modifications can be made in the invention without departing from the spirit and scope of the invention as defined by the appended claims.

The invention claimed is:

1. A hysteresis-type input circuit comprising:
   a hysteresis circuit, which has a first trip point that has a first prescribed value at which voltage of an output signal with respect to voltage of an input signal is changed from a second logic level to a first logic level, and a second trip point that has a second prescribed value at which the output voltage of the output signal is changed from the first logic level to the second logic level, and which undergoes bidirectional transition with a time-delay between a first state in which operation is performed at said first trip point and a second state in which operation is performed at said second trip point;
   a transmission control part that, when transition in the output voltage occurs from said first state to said second state or from said second state to said first state, prohibits or delays transmission of the output signal of said hysteresis circuit to a downstream circuit before said transition has been substantially completed wherein said transmission control part detects the timing at which said transition has been essentially completed according to the potential of a prescribed node in said hysteresis circuit; and
   wherein said transmission control part comprises a first inverter, having a first inversion threshold corresponding to said first trip point, and which outputs the first logic level when the potential of said prescribed node is lower than said first inversion threshold, and outputs the second logic level when said potential of said prescribed node is higher than said first inversion threshold,
   and a second inverter, having a second inversion threshold corresponding to said second trip point, and which outputs the first logic level when the potential of said prescribed node is lower than said second inversion threshold, and outputs the second logic level when said potential of said prescribed node is lower than said second inversion threshold; and
   a timing at which the outputs of said first inverter and second inverter are changed from the same logic level to different logic levels is adopted as the first timing; another timing at which the outputs of said first inverter and second inverter are changed from different logic levels to the same logic level is adopted as a second timing, and, with said second timing, the timing is adopted as that at which said transition has been substantially completed.

2. The hysteresis-type input circuit described in claim 1 wherein:
   said first inversion threshold is set with respect to said first trip point at a value that is offset to a side opposite said second trip point side;
   and said second inversion threshold is set with respect to said second trip point at a value that is offset to a side opposite said first trip point side.

3. The hysteresis-type input circuit described in claim 1 wherein said hysteresis circuit has
   a third inverter that has said input signal input to its input terminal and has its output terminal connected to a first node,
   a fourth inverter that has its input terminal connected to said first node and its output terminal connected to a second node,
   and a fifth inverter that has its input terminal connected to said second node and its output terminal connected to said first node.

4. The hysteresis-type input circuit described in claim 3 wherein:
   said fifth inverter is composed of a MOS transistor of a first electroconductive type connected between a first power source voltage terminal and said first node and a MOS transistor of a second electroconductive type connected between a second power source voltage terminal and said first node;
   a threshold of said MOS transistor of said first electroconductive type is defined by one of said first trip point or second trip point, and a threshold of said MOS transistor of said second electroconductive type is defined by the other of said first trip point and second trip point.

5. The hysteresis-type input circuit described in claim 3 wherein said transmission control part detects the timing at which said transition has been essentially completed in said hysteresis circuit according to the potential of said second node.

6. The hysteresis-type input circuit described in claim 3 wherein said transmission control part has a sixth inverter having its input terminal connected to said first node, for detecting the timing at which said transition has been essentially completed in said hysteresis circuit according to the potential of an output node of said sixth inverter.

7. The hysteresis-type input circuit described in claim 3 wherein said transmission control part detects the timing at which said transition has been essentially completed in said hysteresis circuit according to the potential of said first node.

8. The hysteresis-type input circuit described in claim 1 wherein transmission control part has a gate circuit set in a signal transmission path on the downstream side of said hysteresis circuit, and it cuts off said gate circuit when said change in said output signal is started, and it turns ON said gate circuit after said transition has been substantially completed.

9. The hysteresis-type input circuit described in claim 1 wherein said transmission control part has a driver that drives a signal transmission path on the downstream side to the first logic level or the second logic level corresponding to the potential of the prescribed node of said hysteresis circuit.

10. The hysteresis-type input circuit described in claim 1 wherein said transmission control part has a gate circuit set in the signal transmission path on the downstream side of said hysteresis circuit, and it cuts off said gate circuit when said change in said output signal is started, and it turns ON said gate circuit after said transition has been substantially completed.

11. The hysteresis-type input circuit described in claim 1 wherein said transmission control part has a gate circuit set in a signal transmission path on the downstream side of said hysteresis circuit, and it cuts off said gate circuit when said first output inversion operation or second output inversion operation is started, and it turns ON said gate circuit after said transition has been substantially completed.

* * * * *